(12) United States Patent
Lee et al.

(10) Patent No.: US 6,242,361 B1
(45) Date of Patent: Jun. 5, 2001

(54) PLASMA TREATMENT TO IMPROVE DUV PHOTORESIST PROCESS

(75) Inventors: Shyh-Dar Lee; Chien-Mei Wang, both of Hsinchu; Shuo-Yen Chou, Hualien; Lai-Juh Chen, Hsinchu, all of (TW)

(73) Assignee: Industrial Technology Research Institute, Hsin-chu (TW)

( * ) Notice: Subject to any disclaimer, the term of this patent is extended or adjusted under 35 U.S.C. 154(b) by 0 days.

(21) Appl. No.: 09/458,730

(22) Filed: Dec. 13, 1999

(51) Int. Cl.$^7$ .................. H01L 21/302; H01L 21/461
(52) U.S. Cl. .............. 438/710; 438/711; 438/725; 438/726
(58) Field of Search ............... 438/72, 786, 758, 438/477, 516, 636, 679, 706, 710, 711, 725, 726, 727, 906

(56) References Cited

U.S. PATENT DOCUMENTS

| | | | |
|---|---|---|---|
| 5,312,717 | * 5/1994 | Sachdev et al. | 430/313 |
| 5,679,211 | 10/1997 | Huang | 156/643.1 |
| 5,710,067 | * 1/1998 | Foote et al. | 437/238 |
| 5,716,890 | 2/1998 | Yao | 438/624 |
| 5,783,493 | 7/1998 | Yeh et al. | 438/718 |
| 5,834,372 | 11/1998 | Lee | 438/677 |
| 5,910,453 | * 6/1999 | Gupta et al. | 438/717 |
| 5,968,324 | * 10/1999 | Cheung et al. | 204/192.28 |
| 6,066,568 | * 5/2000 | Kawai et al. | 438/707 |

* cited by examiner

*Primary Examiner*—Matthew Smith
*Assistant Examiner*—Lex H. Malsawma
(74) *Attorney, Agent, or Firm*—George O. Saile; Stephen B. Ackerman

(57) ABSTRACT

A process for removing all amino groups adsorbed on a surface is described. The key feature of the invention is exposure of a layer, particularly an anti-reflection coating that has been deposited by means of PECVD, to a high-density plasma of either argon, oxygen, or a mixture of both. When this is done according to the teachings of the invention, all amino groups are removed from the surface and further processing of photoresist can then be initiated. Even if delays are introduced during subsequent further photoresist processing, dimensionally stable patterns are obtained.

19 Claims, 2 Drawing Sheets

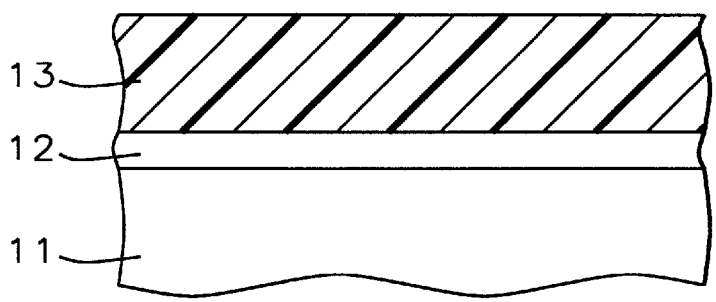
FIG. 1 - Prior Art
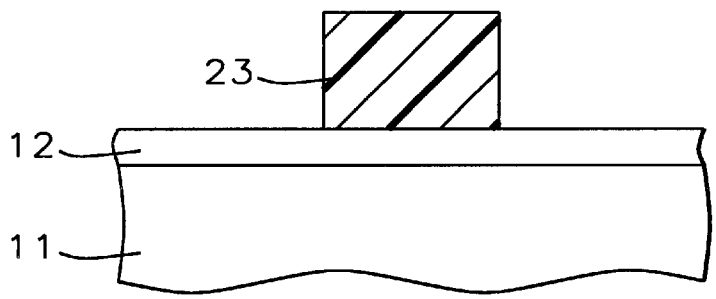
FIG. 2 - Prior Art
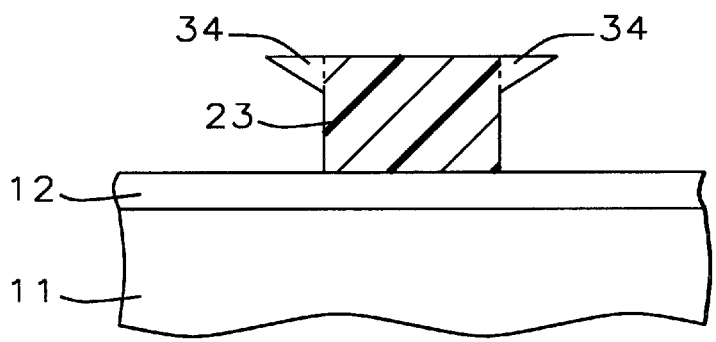
FIG. 3 - Prior Art

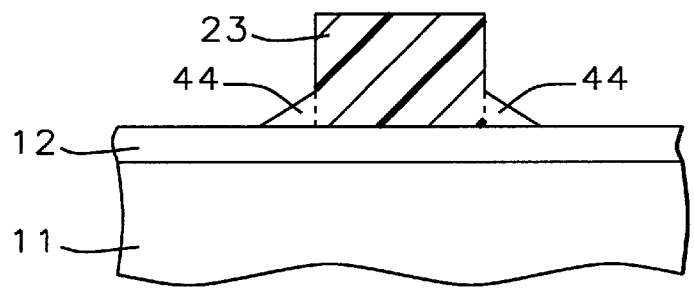
*FIG. 4 - Prior Art*
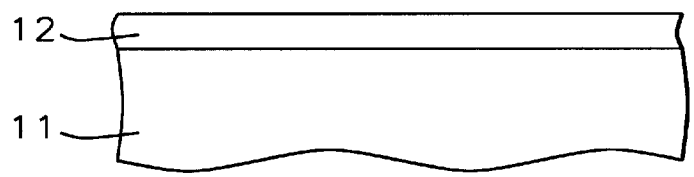
*FIG. 5*
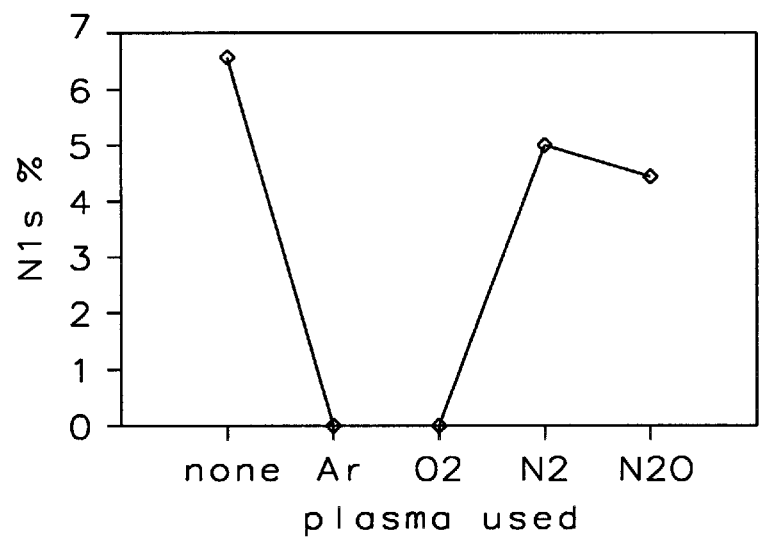
*FIG. 6*

PLASMA TREATMENT TO IMPROVE DUV PHOTORESIST PROCESS

FIELD OF THE INVENTION

The invention relates to the general field of semiconductor integrated circuit manufacturing with particular reference to photoresist processing for deep UV.

BACKGROUND OF THE INVENTION

The demand for smaller device feature sizes has necessitated the move to smaller exposure wave lengths in photolithography. However, light reflection from a given substrate increases with decreasing wavelength of said light. This degrades the performance of photolithographic tools due to reflective notching and thin film interference effects. Anti-reflection layers (ARLs) have been widely used to overcome these problems through destructive phase cancellation or full absorption so as to minimize formation of standing waves in the resist layers. ARL 12 is placed between photoresist layer 13 and substrate 11, as shown in FIG. 1.

Organic ARLs, applied through spin-on techniques, were initially the materials of choice but, as device geometries have continued to shrink into the deep sub micron regime, inorganic materials such as silicon oxynitride, deposited by means of PECVD (plasma enhanced chemical vapor deposition), have proven to be more suitable for the shorter light wavelengths that must, of necessity, be used. The PECVD ARL does, however, have certain problems of its own. In particular, distortion of line profiles in developed photoresist images may occur.

In FIG. 2 we show an idealized cross-section of a line 23 that was formed through proper processing of photoresist layer 13 (of FIG. 1). FIGS. 3 and 4 show common distortions of this line profile that can occur when layer 12 is a ARL of the PECVD type. In FIG. 3, a T-top of additional material 34 has grown out from the line near its top surface while in FIG. 4 additional material 44 is seen to have grown out at the substrate level to provide the line with an added, and unwanted, footing.

It is now known that the origin of these line profile distortions is the presence on the surface of the PECVD ARL of amino ($NH_2$) groups that settle there during the PECVD process. While the ARL is being made ready to receive a layer of photoresist there is often a delay. Additionally, it gets exposed to the air and acidic airborne contaminants and/or basic contaminants at the substrate surface react with the amino groups to form the outgrowths 34 and 44 shown in FIGS. 3 and 4 respectively, leading to a spurious increase in line width within the photoresist pattern.

Various attempts to deal with this problem of photoresist profile instability have been described in the prior art. Among the techniques tried in the past, one of the more popular approaches has been to add an oxide cap over the surface of the ARL immediately following its deposition and prior to exposure to air and later application of the photoresist. Another approach has been to expose the PECVD ARL to a nitrous oxide plasma immediately after its formation. While partially successful, none of these prior art techniques has been able to reliably and completely remove the contaminating amino groups from the surface of an anti-reflective layer.

A routine search of the prior art did not uncover any teachings similar to the present invention. Several references of interest were found, however. For example, Lee (U.S. Pat. No. 5,834,372) teaches a method for pre-treating a semiconductor surface. He purges with an inert gas and then introduces tungsten fluoride gas which is exposed to the surface and improves its nucleation capability for subsequently deposited films.

Yeh et al. (U.S. Pat. No. 5,783,493) subject a BPSG (borophosphosilicate glass) layer to a plasma of argon, nitrous oxide, nitrogen, or oxygen, at a relatively low power (low density plasma), after etch back. This treatment suppresses subsequent precipitation of defects in the BPSG surface.

Yau (U.S. Pat. No. 5,716,890) uses a capping layer of silicon oxide as part of an ILD fabrication process. Said capping layer may, optionally, be exposed to a nitrogen or argon plasma which etches part of the cap away.

Huang (U.S. Pat. No. 5,679,211) uses an oxygen containing plasma as a means to clean the surface of a SOG (spin on glass) in order to remove a polymer residue formed there during a prior etch back processing step.

SUMMARY OF THE INVENTION

It has been an object of the present invention to provide a process for removing all amino groups adsorbed on a given surface.

Another object of the invention has been that said process particularly apply to an anti-reflection layer that is used to underlie a layer of photoresist.

A still further object of the invention has been that patterns formed from photoresist deposited on anti-reflective layers that have been treated according to the process of the present invention, be dimensionally stable.

These objects have been achieved by exposing a layer, particularly an anti-reflection coating that has been deposited by means are PECVD, to a high-density plasma of either argon, oxygen, or a mixture of both. When this is done according to the teachings of the invention, all amino groups are removed from the surface and further processing of the photoresist can then be initiated. Even if delays are introduced during subsequent further photoresist processing, dimensionally stable patterns are still obtained.

BRIEF DESCRIPTION OF THE DRAWINGS

FIG. 1 shows a layer of photoresist on a substrate, with an anti-reflection coating between the resist and the substrate.

FIG. 2 shows the idealized profile of a line formed in photoresist.

FIG. 3 shows how a T-top may grow outwards from the upper edge of a photoresist line.

FIG. 4 shows how a footing may grow outwards from the base of a photoresist line.

FIG. 5 illustrates the process of the present invention wherein the anti-reflection layer is exposed to a high-density plasma.

FIG. 6 shows the percentage of amino groups on the surface after various treatments, confirming that only by the process of the present invention can all such amino groups be fully removed.

DESCRIPTION OF THE PREFERRED EMBODIMENTS

The present invention is a process for the complete removal of any amino groups that accumulate at the surface of a layer, such as an anti-reflection layer. For the latter specific case, the method ensures that the amino groups do not return between the time the layer is laid down and the time it gets coated with a layer of photoresist. Although the method is of a general nature, we will describe it in terms of an ARL that is to be coated with photoresist.

Referring now to FIG. 5, the starting point of the process is the coating of substrate; 11 with ARL 12. The latter may be either organic, deposited through spin-on coating, or inorganic (such as silicon oxynitride), deposited through PECVD. The ARL is deposited to a thickness between about 180 and 450 Angstroms, with about 300 Angstroms being preferred.

Immediately after its deposition, the anti-reflection layer is placed in a gas discharge chamber (which may also be the chamber in which it was formed). Argon gas, oxygen gas, or a mixture of both is then admitted into the chamber at a flow rate between about 50 and 500 SCCM, corresponding to a pressure between about 10 and 15 mtorr. Using either high (2 GHz) or low (13.56 MHz) frequency excitation, high density plasma 51 is initiated and the ARL is exposed to it for between about 2 and 90 seconds. This step is crucial to the success of the process and it is essential that the plasma be of high density (ion density between about $10^9$ and $10^{13}$ ions per cc.).

Once the ARL has been exposed to the plasma it may then be removed from the chamber and further photoresist processing resumed. Provided the ARL was treated as described above, no T-tops or footings will grow along the edges of lines formed in the photoresist, even if there are delays during further photoresist processing, such as post exposure delay (PED). Thus, for ARLs treated according to this process, photoresist patterns that are dimensionally stable will result, including patterns that were formed through exposure to deep UV (wavelength being 248 nm).

Aside from the effectiveness of the process as evidenced by the stable patterns, additional proof that all amino groups were removed from the surface was obtained by examining a surface that had been subjected to the process, by means of ESCA (electron spectroscopy for chemical analysis). With this tool, amino groups are detected through the N1s line. FIG. 6 shows the strength of N1s (measured as a percentage) after treatment with plasmas of several different compositions, including the case of no treatment. As can be seen, the N1s % was about 6.5 for no treatment, and around 5 for treatment in either nitrogen or nitrous oxide while for oxygen and argon it was exactly zero, confirming that ALL, not only some, amino groups are removed by the process of the present invention.

While the invention has been particularly shown and described with reference to the preferred embodiments thereof, it will be understood by those skilled in the art that various changes in form and details may be made without departing from the spirit and scope of the invention.

What is claimed is:

1. A cleaning process, comprising:
providing a body having a surface on which are present amino groups at a surface concentration greater than about 6 percent;
exposing said surface to a mixture of argon and oxygen gases that has been electrically excited to form a plasma having an ion density between about $10^9$ and $10^{13}$ ions per cc; and thereby
reducing said surface concentration of amino groups to zero.

2. The process of claim 1 wherein the argon has a concentration in the mixture between 0 and 100 percent.

3. The process of claim 1 wherein the surface is exposed to the plasma for between about 2 and 90 seconds at a pressure between about 10 and 15 mtorr.

4. A photoresist process comprising:
providing a substrate;
depositing an anti-reflection layer on said substrate;
placing said anti-reflection layer and substrate in a gas discharge chamber;
admitting argon gas into said chamber and then electrically exciting the argon, whereby a high-density plasma having between about $10^9$ and $10^{13}$ ions per cc. is formed;
exposing the anti-reflection layer to the high-density plasma;
then removing the substrate from the chamber and depositing a layer of photoresist over said anti-reflection layer; and
then further processing said photoresist layer to form a pattern, said pattern having dimensions that are unaffected by delays that occur during said further processing step.

5. The process of claim 4 wherein excitation of the plasma is effected using a low frequency of 13.56 MHz.

6. The process of claim 4 wherein excitation of the plasma is effected using a high frequency of 2 GHz.

7. The process of claim 4 wherein the argon gas is admitted into the chamber at a flow rate that is between about 50 and 500 SCCM and the anti-reflection layer is exposed to the plasma for between about 2 and 90 seconds.

8. The process of claim 4 wherein the anti-reflection layer is deposited to a thickness that is between about 180 and 450 Angstroms.

9. The process of claim 4 wherein the anti-reflection layer is an inorganic material deposited using PECVD.

10. The process of claim 4 wherein the anti-reflection layer is an organic material deposited by spin coating.

11. The process of claim 4 wherein the photoresist is exposed, during said further processing step, to radiation in the deep ultraviolet range.

12. A photoresist process comprising:
providing a substrate;
depositing an anti-reflection layer on said substrate;
placing said anti-reflection layer and substrate in a gas discharge chamber;
admitting oxygen gas into said chamber and then electrically exciting the oxygen, whereby a high-density plasma having between about $10^9$ and $10^{13}$ ions per cc. is formed;
exposing the anti-reflection layer to the high-density plasma;
then removing the substrate from the chamber and depositing a layer of photoresist over said anti-reflection layer; and
then further processing said photoresist layer to form a pattern, said pattern having dimensions that are unaffected by delays that occur during said further processing step.

13. The process of claim 12 wherein excitation of the plasma is effected using a low frequency of 13.56 MHz.

14. The process of claim 12 wherein excitation of the plasma is effected using a high frequency of 2 GHz.

15. The process of claim 12 wherein the oxygen gas is admitted into the chamber at a flow rate that is between about 50 and 500 SCCM and the anti-reflection layer is exposed to the plasma for between about 2 and 90 seconds.

16. The process of claim 12 wherein the anti-reflection layer is deposited to a thickness that is between about 180 and 450 Angstroms.

17. The process of claim 12 wherein the anti-reflection layer is an inorganic material deposited using PECVD.

18. The process of claim 12 wherein the anti-reflection layer is an organic material deposited by spin coating.

19. The process of claim 12 wherein the photoresist is exposed, during said further processing step, to radiation in the deep ultraviolet range.

* * * * *